United States Patent
Schwarz

[11] Patent Number: 5,909,404
[45] Date of Patent: Jun. 1, 1999

[54] REFRESH SAMPLING BUILT-IN SELF TEST AND REPAIR CIRCUIT

[75] Inventor: William Schwarz, San Leandro, Calif.

[73] Assignee: LSI Logic Corporation, Milpitas, Calif.

[21] Appl. No.: 09/049,852

[22] Filed: Mar. 27, 1998

[51] Int. Cl.[6] .................................................... G11C 7/00
[52] U.S. Cl. ..................... 365/201; 365/200; 365/230.03
[58] Field of Search ............................. 365/201, 230.03, 365/200, 211

[56] References Cited

U.S. PATENT DOCUMENTS

| | | |
|---|---|---|
| 4,057,788 | 11/1977 | Sage . |
| 4,633,438 | 12/1986 | Kume et al. . |
| 4,661,929 | 4/1987 | Aoki et al. . |
| 4,715,014 | 12/1987 | Tuvell et al. . |
| 4,910,709 | 3/1990 | Dhong et al. . |
| 4,935,896 | 6/1990 | Matsumura et al. . |
| 5,021,999 | 6/1991 | Kohda et al. . |
| 5,119,330 | 6/1992 | Tanagawa . |
| 5,159,570 | 10/1992 | Mitchell et al. . |
| 5,172,338 | 12/1992 | Mehrotra et al. . |
| 5,276,843 | 1/1994 | Tillinghast et al. . |
| 5,278,796 | 1/1994 | Tillinghast et al. . |
| 5,282,162 | 1/1994 | Ochii . |
| 5,283,761 | 2/1994 | Gillingham . |
| 5,351,210 | 9/1994 | Saito . |
| 5,357,464 | 10/1994 | Shukuri et al. . |
| 5,394,362 | 2/1995 | Banks . |
| 5,410,547 | 4/1995 | Drain . |
| 5,459,686 | 10/1995 | Saito . |
| 5,521,865 | 5/1996 | Ohuchi et al. . |
| 5,532,955 | 7/1996 | Gillingham . |
| 5,568,437 | 10/1996 | Jamal . |
| 5,577,050 | 11/1996 | Bair et al. . |
| 5,596,534 | 1/1997 | Manning . |
| 5,600,591 | 2/1997 | Takagi . |
| 5,652,729 | 7/1997 | Iwata et al. . |
| 5,664,166 | 9/1997 | Isfeld . |
| 5,689,690 | 11/1997 | Lesmeister et al. . |
| 5,699,307 | 12/1997 | Greason et al. ......................... 365/201 |
| 5,701,308 | 12/1997 | Attaway et al. . |
| 5,724,562 | 3/1998 | Ishiwaki et al. . |
| 5,742,615 | 4/1998 | Ishii . |

OTHER PUBLICATIONS

Abbott, et al., "A 4K MOS Dynamic Random–Access Memory," IEEE Journal of Solid–State Circuits, vol. SC–8, No. 5, Oct. 1973, pp. 292–298.

*Primary Examiner*—Vu A. Le
*Attorney, Agent, or Firm*—Conley, Rose & Tayon, PC; B. Noel Kivlin

[57] ABSTRACT

A method for testing a memory device which statistically characterizes the failure time for a subset of cells sampled from the memory array before performing testing of the memory array in general. The memory device includes a testing unit which determines the failure times for cells in the sample subset, and a parameter calculation unit which computes one or more statistical parameters from the failure times. These statistical parameters are then used to determine a refresh pause time which is used in a data retention test of the memory array. The testing method may be performed when power is applied to the memory device. Thus, the BIST method may provide for the accurate detection of memory faults in the memory array at any power-up temperature. In addition, the testing method may be performed after the memory array attains an operational temperature, or in response to an operating system command.

29 Claims, 9 Drawing Sheets

REFRESH SAMPLING BUILT-IN SELF TEST AND REPAIR CIRCUIT

BACKGROUND OF THE INVENTION

1. Field of the Invention

This invention relates to the field of digital electronic memory devices, and in particular to a method for testing and repairing these devices in the field.

2. Description of the Related Art

It is common practice for the manufacturers of memory chips to test the functionality of the memories at the manufacturing site. After the chips have been tested and certified for shipment, upon sale to the users, the users generally depend upon the reliability of the chips for their own systems to function properly. As the line width of memory cells within a memory array circuit chip continue to shrink (now at less than half a micron), this reliability becomes more difficult to achieve. One of the challenges for the manufacturers of memory devices, is to increase memory capacity without decreasing chip yields due to malfunctioning parts.

Before the memory chips are released for shipment, they typically undergo testing to verify that each of the memory cells within the memory array is functioning properly. This testing method is routinely done because it is not uncommon for a significant percentage of the memory cells within the chip to fail, either because of manufacturing defects or degradation faults.

In the past, chip memories have been tested using an external memory tester or Automatic Test Equipment (ATE) at the manufacturing site. This testing technique is not available to users once the chips have been shipped, making it difficult to detect faulty memory cells at the user site. Even if test equipment is available to users, field repairs are expensive, time-consuming, and impractical.

In addition, some repairs of memories have also been performed at the manufacturing site. Conventional repairing techniques bypass the defective cells using fuseable links that cause address redirection. However, these techniques require significant capital investment for implementing the technical complexity of the repairing process, and moreover, fail to address the possibility of failure after shipment from the manufacturing facility.

Because of the complexity of field repairs, some memory chips have been equipped with built-in self test (BIST) and built-in self repair (BISR) circuitry. As used herein, the term "BIST" refers to the actual test, while "BIST unit" and "BIST circuitry" refer to the circuitry that performs BIST. Similarly, "BISR" refers to the process of builtin self repair, while "BISR unit" and "BISR circuitry" refer to the circuitry that performs BISR. BIST operates by writing and reading various patterns to/from the memory to determine various kinds of memory faults. In particular, in a data retention test, a BIST unit writes a data value to a memory cell, waits for a pause interval, and subsequently reads the memory cell. By comparing the data written and subsequently returned from the memory cell, the BIST unit is able to determine whether the memory cell is faulty. If failing cells are present, the BISR circuitry reassigns the row or column containing the failing cell to a spare row or column in the memory array. Generally, BIST and BISR are performed each time power is applied to the system, and thus, latent failures that occur between subsequent system power-ups may be detected in the field.

At present, BIST and BISR are employed with static memories. Due to the higher storage capacity of dynamic memories, it would be desirable to apply BIST and BISR methods to dynamic memories. However, for dynamic memories, the inherent sensitivity of refresh time to temperature severely complicates the data retention test. Since, the refresh time of a dynamic memory cell decreases strongly with increasing temperature, it may not be possible to choose a fixed BIST pause time which will suffice to detect faulty memory cells at all temperatures. In other words, a pause time which is chosen to optimally detect faulty memory cells at a nominal powering-up temperature may result in one of the following: (a) missing faulty cells at power-up temperatures lower than the nominal temperature, or (b) false alarms, i.e. declaring normal cells to be faulty, at temperature higher than the nominal temperature. The power-up temperature is defined to be the temperature of the memory chip at the time power it applied.

Furthermore, since BIST and BISR are conducted at the conditions that prevail at the time the memory device is powered on, they may not identify temperature sensitive failures. While BIST and BISR may perform a data retention test at power-up, the temperature of the system at that time may not be sufficient to induce cell failures. Subsequently, however, the temperature of the system may increase to a point that one or more memory cells will fail. Since BIST and BISR have already been performed at system power-on, BISR does not redirect accesses to these cells, which may result in a catastrophic system error.

Another problem arises in connection with the fact that it is generally desirable for dynamic memories to have a large refresh interval to minimize memory bus bandwidth required for the refresh function during normal operation. However, this implies that the BIST may take an inordinately long time to perform a data retention test on a dynamic memory device.

SUMMARY OF THE INVENTION

The problems outlined above are in large part solved by a BIST method which statistically characterizes the failure time for a subset of cells sampled from the dynamic memory array before performing testing of the dynamic memory array in general. In one embodiment, the dynamic memory device includes a BIST unit which determines the failure times for cells in the sample subset, and a parameter calculation unit which computes one or more statistical parameters from the failure times. These statistical parameters are then used to determine a refresh pause time which is used to test the dynamic memory array. Since the statistical characterization of memory cell failure times is performed as part of the BIST, the BIST method may advantageously provide a refresh pause time which is optimal for the conditions which prevail at the time the BIST is performed. In one embodiment, the BIST method may be performed when power is applied to the dynamic memory device. Thus, the BIST method may provide for the accurate detection of memory faults in the dynamic memory array at any power-up temperature. This embodiment may advantageously provide for the testing and repair of dynamic memory arrays.

In another embodiment, the BIST method may be performed in response to the dynamic memory array attaining a predetermined operational temperature. Thus, the BIST method may advantageously detect memory cell faults which are induced by the higher temperatures which manifest after power-up.

In one embodiment, BIST is performed in conjunction with a plurality of weak write circuits. A weak write circuit is operable to selectively couple dynamic memory cells to a data line through a direct path or a resistively loaded path. During the failure time characterization phase and the data retention testing phase, the BIST unit writes dynamic memory cells through the resistively loaded path. Since less charge is posited in the dynamic memory cells during weak write accesses, refresh times and failure times are shorter than they would be if normal writes had been performed. Thus, the BIST method may advantageously provide a shorter duration of testing for a dynamic memory array. In particular, since the refresh time of a dynamic memory array is strongly dependent on the amount of charge deposited in a write operation, the weak write circuit may advantageously provide for a shorter duration of BIST for a dynamic memory array.

Broadly speaking, the present invention contemplates a method for on-chip testing of a memory device that contains a memory array. The method comprises the steps of (i) determining failure times for cells in a subset of the memory array; (ii) calculating one or more statistical parameters based on the failure times; (iii) determining a refresh pause time based on the one or more statistical parameters; and (iv) applying a data retention test to the memory array using the refresh pause time, where the testing of the memory array identifies an address of a faulty cell within the memory array.

The present invention further contemplates a system for detecting data retention faults. The system includes (a) a memory array with a plurality of memory cells; (b) a testing unit coupled to the memory array, and configured to determine failure times for a subset of the plurality of memory cells; and (c) a parameter calculation unit coupled to receive the failure times, and configured to determine a refresh pause time based on the failure times. The testing unit is further configured to receive the refresh pause time and to detect faulty cells among the plurality of memory cells by performing a data retention test using the refresh pause time.

The present invention further contemplates a memory device comprising a plurality of memory cells, a data line, and a weak write circuit coupled to the data line and one or more of the plurality of memory cells. The weak write circuit includes (a) a first gating device coupled to the data line and the one or more cells; (b) a resistive device coupled to the data line; (c) a second gating device coupled to the resistive device and the one or more cells; and (d) a weak enable line coupled to a control input of the first gating device and to a control input of the second gating device. The first gating device is configured to couple the data line to the one or more cells when a first logical value is asserted on the weak enable line. The second gating device is configured to decouple the resistive device from the one or more cells when the first logical value is asserted on the weak enable line. Furthermore, the first gating device is configured to decouple the data line from the one or more cells when a second logical value is asserted on the weak enable line. Also the second gating device is configured to couple the resistive device to the one or more cells when the second logical value is asserted on the weak enable line.

BRIEF DESCRIPTION OF THE DRAWINGS

Other objects and advantages of the invention will become apparent upon reading the following detailed description and upon reference to the accompanying drawings in which.

Figure 1:
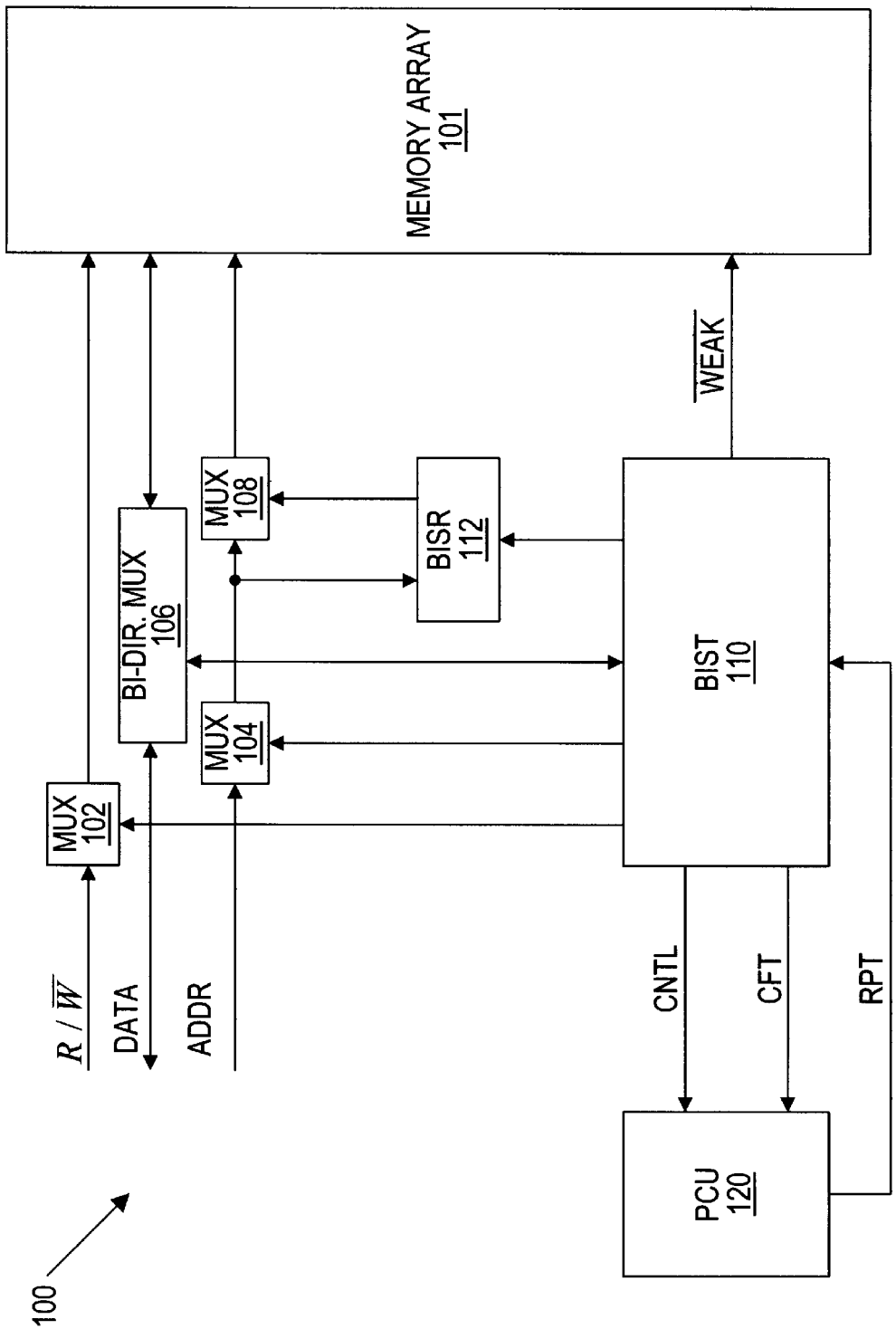
FIG. 1 depicts a block diagram of one embodiment of a memory storage device 100 capable of built-in self test and repair

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, there is shown a block diagram of one embodiment of a memory storage device 100 capable of built-in self test and repair. The memory storage device 100 includes a dynamic memory array 101, multiplexers 102, 104, 106 and 108, a built-in self test (BIST) unit 110, a built-in self repair (BISR) module 112, and a parameter calculation unit 120.

The dynamic memory array 101 receives an address signal (ADDR) and a read/write signal (R/$\overline{\text{W}}$), and either receives or provides a data signal. If the read/write signal indicates a write operation, dynamic memory array 101 stores the data represented by the data signal in a memory location indicated by the address signal. If the read/write signal indicates a read operation, dynamic memory array 101 detects the data stored in the memory location indicated by the address signal and drives the data signal on the data lines. The multiplexers 102, 104, 106, and 108 provide for steering and re-direction of the address, data, and read/write signals.

BIST unit 110 controls multiplexers 102, 104 and 106. When the BIST unit 110 is active, multiplexers 102 and 104 forward the read/write and address signals, respectively, from the BIST unit 110 to dynamic memory array 101. For test write operations, multiplexer 106 forwards test data from the BIST unit 110 to dynamic memory array 101. For test read operations, multiplexer 106 directs data from dynamic memory array 101 to the BIST unit 110. BIST unit 110 controls weak enable line ($\overline{\text{WEAK}}$) which couples to dynamic memory array 101. Multiplexer 108 is controlled by the BISR module 112. As explained further below, when the BISR module 112 detects an address to a faulty memory location, it maps the address to the address of a redundant memory location. The multiplexer 108 is then used to select the uncorrected address when no fault location is recognized by the BISR module 112, and to select the remapped address when the BISR module 112 detects an address to a faulty memory location. The parameter calculation unit 120 receives a cell failure time signal (CFT) from BIST unit 110, and provides a refresh pause time signal (RPT) to the BIST unit 110. In addition, BIST unit 110 is coupled to the parameter calculation unit 120 through a control bus CNTL.

Generally speaking, memory device 100 may provide improved BIST and BISR functionality by incorporating a statistical failure time characterization. In one embodiment, BIST unit 110 determines the failure times for a subset of cells from the dynamic memory array 101. The parameter calculation unit 120 uses these failure times to determine one or more statistical parameters based on the failure times. In one embodiment, the parameter calculation unit 120 calculates an average failure time, and in another embodiment, both an average failure time and a standard deviation of failure time. From the one or more statistical parameters, the parameter calculation unit 120 calculates a refresh pause time which is used by BIST unit 110 to perform a data retention test on dynamic memory array 101. Since the statistical characterization of memory cell failure time is performed as part of the BIST, the parameter calculation unit 120 may advantageously provide a refresh pause time which is optimized for the dynamic memory array 101 at the conditions which prevail at the time the BIST is performed.

In one embodiment of memory device 100, the statistical characterization of failure times and determination of the refresh pause time are performed when power is applied to the dynamic memory device 101. Thus, the BIST unit 110 may advantageously detect memory cell faults in the dynamic memory array at any power-up temperature. Dynamic memory cells are subject to leakage currents and hence must be refreshed periodically. The leakage currents are highly sensitive to temperature. Accordingly, the refresh time for a dynamic memory array decreases significantly with increasing temperature. By performing the statistical characterization of failure times and determination of the refresh pause time at power-up, a dynamic memory array may be tested using a refresh pause time which is optimal for the prevailing power-up temperature.

In a second embodiment of memory device 100, the statistical characterization of failure times and determination of the refresh pause time are performed in response to the dynamic memory array attaining a predetermined operational temperature. Thus, the BIST unit 110 may advantageously detect memory cell faults which are induced by the higher temperatures which manifest after power-up. As mentioned above, current leakage mechanisms in a DRAM cell accelerate with increasing temperature. DRAM cells which may pass a data retention test at power-up may fail during the transition to the higher temperatures which prevail during typical operation. Thus, this second embodiment, by performing the statistical characterization of failure time and the determination of refresh pause time in response to the attainment of operational temperature may advantageously provide for the detection of temperature induced faults in DRAM arrays.

Furthermore, in the second embodiment, the memory device 100 may include a heating unit and/or a temperature sensor to accelerate the attainment of the predetermined operational temperature. In another embodiment, a specified time interval is allowed for heating, and once the interval has elapsed, testing occurs at the resulting temperature.

In a third embodiment of memory device 100, the statistical characterization of failure times and determination of the refresh pause time are performed in response to a command asserted by an operating system routine running on a central processing unit (CPU) coupled to the memory device 100. The operating system routine may advantageously be configured to detect errors in read and/or write accesses to dynamic memory array 101. In response to an unacceptably high rate of memory access error, the operating system routine may direct the memory device to perform BIST and BISR, including the statistical characterization of memory cell failure times.

In a fourth embodiment of memory device 100, BIST and BISR, including statistical characterization of memory cell failure times, are performed in response to a user input. The user may be provided with a hardware interface for initiating BIST and BISR on the memory device 100. In an alternate embodiment, the user may be provided with a software interface for initiating the BIST and BISR, i.e. via software running on a CPU coupled to the memory device 100.

In a fifth embodiment of memory device 100, dynamic memory array 101, BIST unit 110, BISR unit 112, and parameter calculation unit 120 are integrated onto a common substrate. Thus, the time required to perform BIST and BISR may be advantageously decreased due to the higher clock rates and shorter data path lengths attainable within a common substrate.

BIST unit 110 cycles dynamic memory array 101 through various test patterns upon power-up. Every time a failing row or column is detected, this information is conveyed to BISR unit 112, which attempts to reassign accesses to the failing location to a redundant row or column within the dynamic memory array I101. BISR unit 112 monitors all incoming addresses to determine if any match one of the failing addresses detected by the BIST unit 110. If a match is found, BISR unit 112 provides a corrected address via multiplexer 108 so that the reassigned memory location is accessed instead of the location originally addressed.

Figure 2:
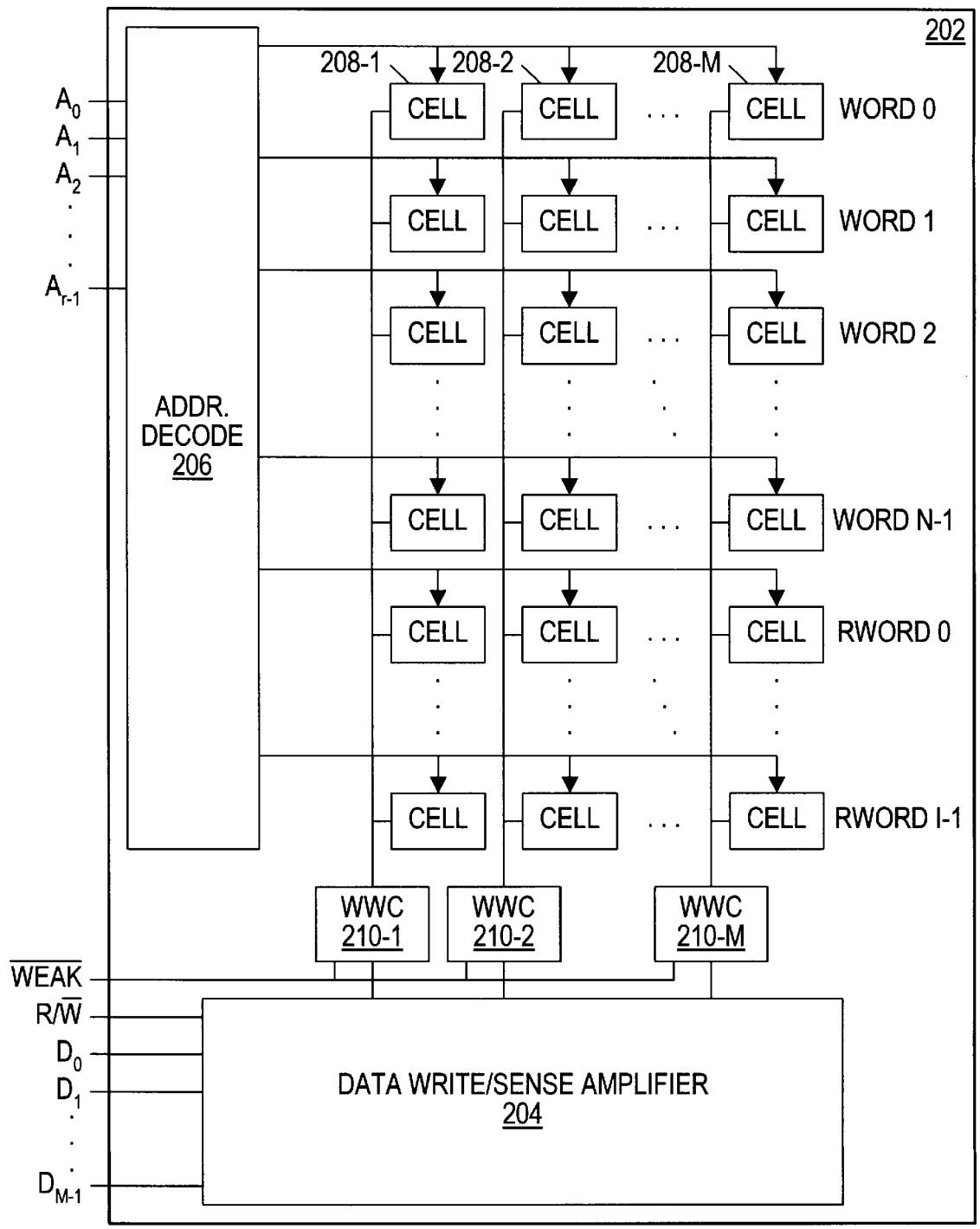
FIG. 2 depicts a block diagram of one embodiment of a memory array.

Referring now to FIG. 2, a block diagram of one embodiment of the dynamic memory array 101 is shown. The dynamic memory array 101 includes a ground plane 202, a data write/sense amplifier 204, an address decoder 206, a plurality of dynamic memory cells 208-1 through 208-M, and a plurality of weak write circuits 210-1 through 210-M (collectively referred to a weak write circuits 210). The ground plane 202 is a conductive path held at a constant voltage to shield the signal lines within the dynamic memory array from electrical noise. The data write/sense amplifier 204 senses data stored in a row of dynamic memory cells during a read operation and drives the detected data on data lines $D_0$ through $D_{M-1}$. The data write/sense amplifier 204 retrieves data from data lines $D_0$ through $D_{M-1}$ and stores the data in a row of dynamic memory cells during a write operation. The type of operation being performed by the data write/sense amplifier is controlled by the read/write line. Each row of dynamic memory cells is referred to as a word. The row of dynamic memory cells being read from or written to is determined by the address decoder 206 which receives an address on lines $A_0$ through $A_{r-1}$ and responsively asserts a word line. The row of cells coupled to the asserted word line can then be accessed for read or write operations. The dynamic memory array 101 includes a set of redundant words which can be used in place of faulty words. When a faulty word is detected, subsequent accesses to the address of the faulty word can be redirected to one of the redundant words.

Each of the weak write circuits 210 is coupled to (a) a weak enable line controlled by BIST unit 110, and (b) a data bit line from the data write/sense amplifier. In addition, each of the weak write circuits 210 is coupled to a column of dynamic memory cells in the dynamic memory array 101. A weak write circuit, e.g. weak write circuit 210-1, is configured to selectively couple a data bit line to a column line either through a direct path or through a resistively loaded path. BIST unit 210 controls whether the direct or resistively loaded paths of weak write circuits 210 are selected by driving the weak enable line accordingly. In general, during read accesses to dynamic memory array 101, BIST unit 110 asserts a first logical value on weak enable line to select the direct path coupling in the weak write circuits 210. During certain write operations, to be explained further below, BIST unit 110 asserts a second logical value on the weak enable line to select the resistively loaded paths in weak write circuits 210. By coupling a bit line to a column line through a resistively loaded path, less charge is deposited into an addressed cell of the column. The addressed cell will require less time to manifest a data retention fault due to current leakage.

It is noted that in one embodiment of dynamic memory array 101, weak write circuits 210 are integrated onto a common substrate with a ground plane 202, a data write/sense amplifier 204, an address decoder 206, and the plurality of dynamic memory cells 208-1 through 208-M.

Figure 3:
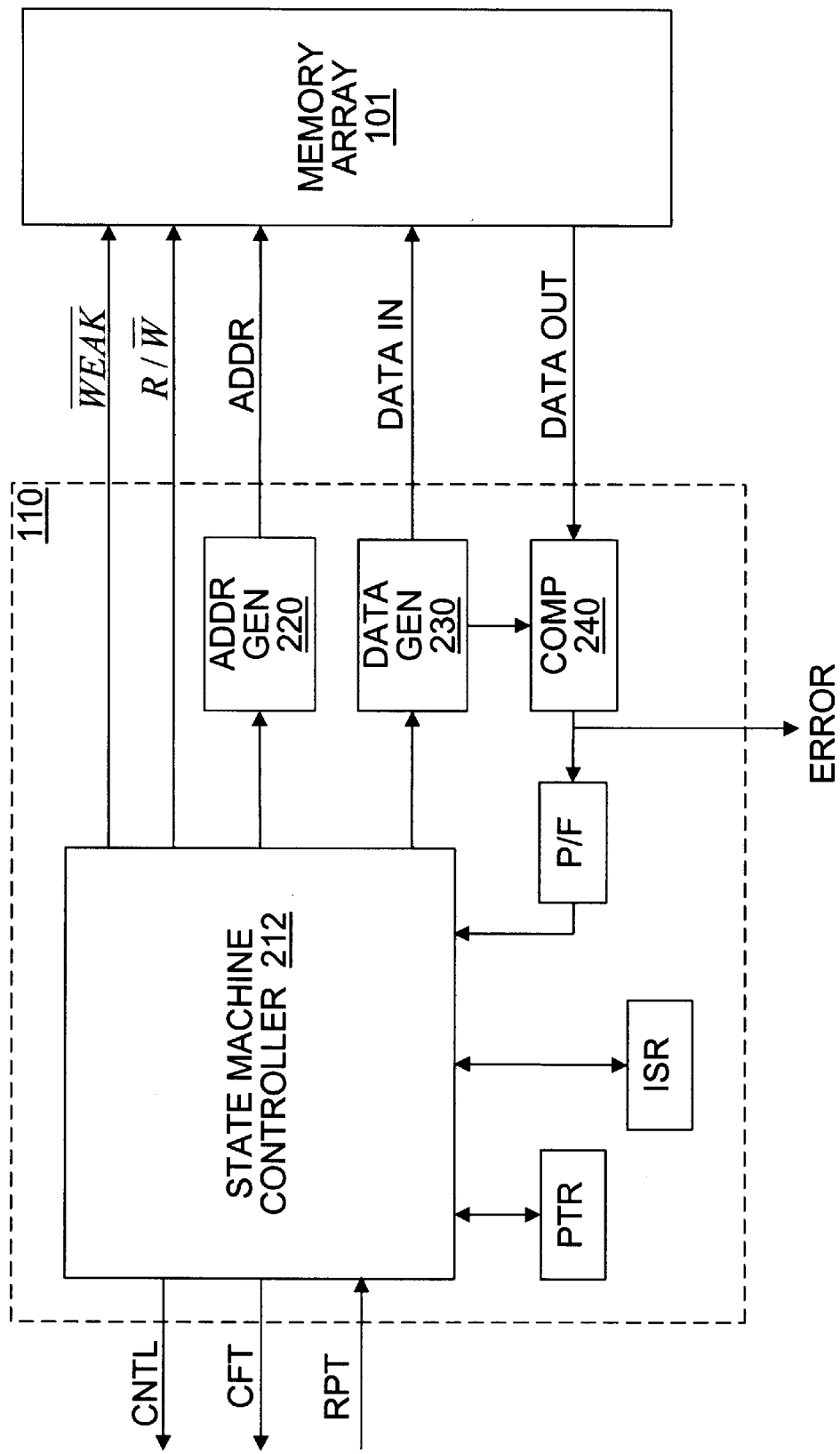
FIG. 3 depicts a block diagram of one embodiment of built-in self test circuitry within a memory storage device.

Referring now to FIG. 3, a functional block diagram of one embodiment of BIST unit 110 is shown in greater detail. Circuit portions corresponding to those of FIG. 1 are numbered identically. Portions of BIST unit 110 depicted in FIG. 3 include a state machine controller 212, a BIST address generator 220, a BIST data generator 230, a comparator 240, a pass/fail register (P/F), a pause time register (PTR), and an initial state register (ISR). State machine controller 212 drives a BIST read/write signal to dynamic memory array 101, as well as inputs to BIST address generator 220 and BIST data generator 230. Furthermore, state machine controller 212 drives weak enable line (WEAK) to control whether a weak access or normal access is performed to the dynamic memory array 101. An access is said to be weak when the resistively loaded paths are selected in weak write circuits 210.

During a write access, BIST address generator 220 drives a BIST address to dynamic memory array 101, while BIST data generator 230 drives a BIST data in signal to dynamic memory array 101. The BIST data in signal is also provided to comparator 240. During a read access, comparator 240 receives a data out signal from dynamic memory array 101. The BIST address signal and BIST read/write signals include control signals for operating multiplexers 102, 104, and 106. The output of comparator 240, an error signal, is conveyed to BISR unit 112, where it is processed as described further below. The output of comparator 240 is also conveyed to pass/fail register (P/F). The output of the pass/fail register P/F is conveyed to the state machine controller 212. The pause time register PTR and the initial state register ISR are coupled to the state machine controller 212. The state machine controller 212 is coupled to the parameter calculation unit 120 through cell failure time signal CFT and refresh pause time signal RPT.

State machine controller 212 is configured to direct the determination of failure times for cells in a subset of the dynamic memory array 101. In one embodiment of the subset, the subset is a set of consecutively addressed cells from the dynamic memory array 101. Thus, the addressing of cells in the subset may advantageously be simplified. In a second embodiment of the subset, the subset is a set of non-adjacent cells from the dynamic memory array 101.

Thus, the heating of one cell in the subset due to read/write accesses may advantageously not be able to effect the measurement of the cell failure times of other cells in the subset. A cell failure time is defined to be the pause time between a write and subsequent read access to the cell which indicates a transition between data retention and non-retention. In other words, the cell failure time is the time required for the charge deposited by a write operation to diminish to that threshold level which marks the distinction between a logical HIGH and logical LOW value.

Data retention is measured by a data retention test. State machine controller 212 executes a data retention test by writing to a dynamic memory cell, pausing, and subsequently reading the dynamic memory cell. The data written to the cell and the data returned from the cell are compared to determine data retention or non-retention, equality denoting data retention, and inequality denoting non-retention. In order to determine the cell failure time, state machine controller 212 repeatedly performs the data retention test with changing values for the pause time. For example, if a first data retention test reports data retention, the pause times for subsequent data retention tests may be successively increased until non-retention is detected. The transition between retention and non-retention identifies the cell failure time. In addition, if a first data retention test reports data non-retention, the pause times for subsequent data retention tests may be successively decreased until data retention is detected. Again, the transition between retention and non-retention identifies the cell failure time. In one embodiment, during the data retention tests, state machine controller 212 performs weak write operations and normal reads. Since a weak write deposits less charge into a cell than a normal write, the cell failure time is advantageously decreased. This translates to a decreased overall time to determine the failure times for the sample subset.

State machine controller 212 provides the failure times for cells of the sample subset to the parameter calculation unit 120 through cell failure time signal CFT. The parameter calculation unit 120 uses the cell failure times to determine a refresh pause time. The state machine controller 212 receives the refresh pause time from the parameter calculation unit 120 through refresh pause time signal RPT.

State machine controller 212 is further configured to detect column faults, row faults, bridging faults, "stuck-at" faults, and data retention faults in dynamic memory array 101, Column and row faults are caused by defective bit lines and defective word lines, respectively. A bridging fault indicates a cell is shorted to an adjoining cell, and stuck-at faults indicate a particular cell is "stuck" at a certain value. Data retention faults indicate the cell has failed the refresh pause time specification. As discussed further below, BISR module 112 is connected to dynamic memory array 101 to repair faults detected by BIST unit 110. The BIST unit 110 transfers detected fault addresses to BISR module 112 to enable BISR module 112 to repair the faults.

State machine controller 212, address generator 220, and data generator 230 operate to generate patterns for detecting column faults, row faults, bridging faults, "stuck-at" faults, and data retention faults. These elements produce a data pattern that provides optimal fault coverage in identifying the faulty memory cells. In one embodiment, memory faults are detected by performing separate tests, namely a column lines test, a row lines test, a bridging test, a data storage test, and a data retention test.

In response to receiving the refresh pause time from the parameter calculation unit 120, state machine controller 212 performs a data retention test on the whole dynamic memory array 101 to detect data retention faults. State machine controller 212 directs BIST address generator 220 to generate addresses for every location of dynamic memory array 101. In one embodiment, address generator 220 includes a counter circuit that is initialized to point to the first address in dynamic memory array 101, and subsequently cycles through the addresses of all available locations in the dynamic memory array 101 in response to appropriate input signals from state machine controller 212. For each location of the dynamic memory array 101, state machine controller 212 directs a weak write to an addressed location, pauses for the refresh pause time, and subsequently performs a normal read of the addressed location.

During a weak write, state machine controller 212 controls weak enable signal $\overline{WEAK}$ to select the resistively loaded paths of weak write circuits 210, and drives the read/write signal R/$\overline{W}$ to select a write access into dynamic memory array 101. In addition, data generator 230 drives the data in signal with a first data value in response to control signals from state machine controller 212. Data generator 230 also provides the first data value to comparator 240. During a normal read, state machine controller 212 controls weak enable signal $\overline{WEAK}$ to select the directly coupled paths of weak write circuits 210, and drives the read/write signal R/$\overline{W}$ to select a read access from dynamic memory array 101. The contents of the addressed memory location are supplied to comparator 240 as the data out signal from the dynamic memory array 101.

Comparator 240 compares the first data value and the data value returned from the addressed location to determine whether or not a data retention fault has occurred in the addressed location. The output of comparator 240 is provided to BISR unit 112 to as an error signal to enable repair of data retention faults. In particular, when comparator 240 detects a mismatch between the first data value and the returned data value, the output of comparator 240 serves as an error signal which induces BISR unit 112 to substitute the failindynamic memordress with the address of a redundant word of the dynamic memory array 101.

After BIST unit 110 has completed testing of the dynamic memory array 101, state machine controller 212 becomes inactive, and the multiplexers 102, 104, and 106 are set to select the external read/write, address, and data signal lines. At this point, memory storage device 100 can now satisfy requests for dynamic memory array 101 from the external pins.

Figure 4A:
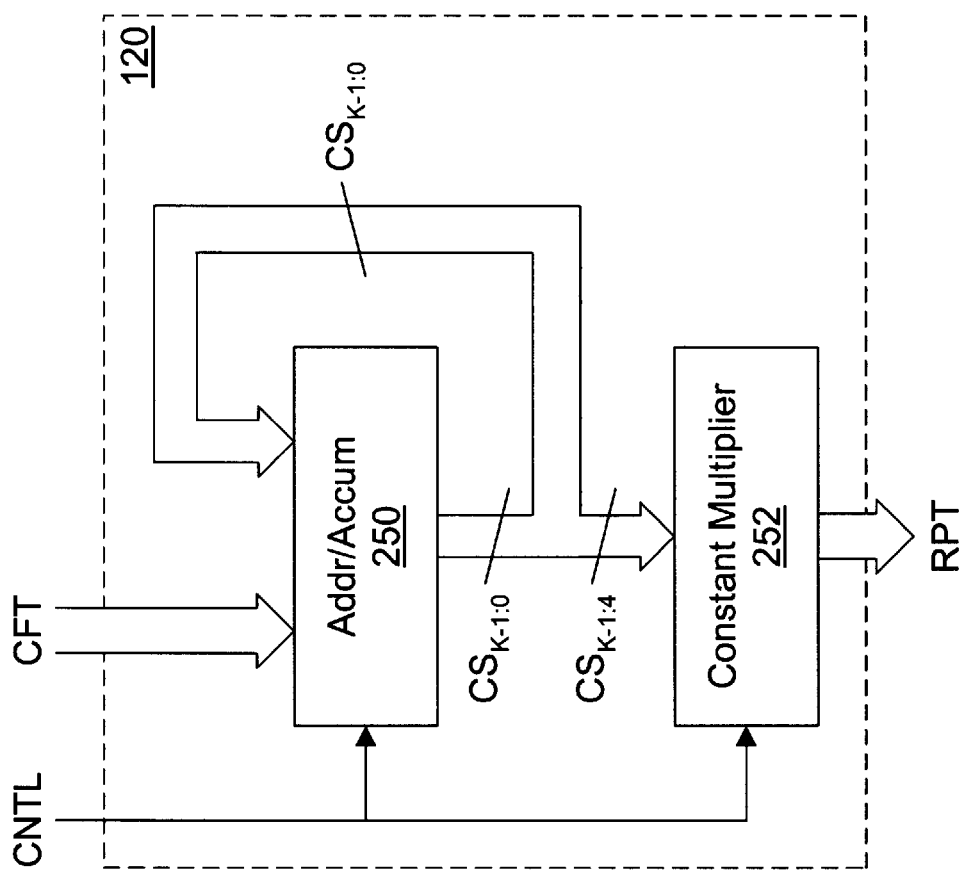
FIG. 4A depicts a block diagram of one embodiment of a parameter calculation unit 120 within a memory storage device.

Referring now to FIG. 4A, a block diagram of one embodiment of parameter calculation unit 120 is shown. As illustrated, parameter calculation unit 120 comprises an adder/accumulator 250 and a constant multiplier 252. Adder/accumulator 250 is configured to maintain a cumulative sum of the cell failure times provided by BIST unit 110 through cell failure time signal CFT. In response to an accumulate signal received via control bus CNTL, adder accumulator 250 adds the cell failure time signal to the cumulative sum. The output CS of the adder/accumulator 250 represents the instantaneous value of the cumulative sum. The output CS is provided to an input of adder/accumulator 250 in feedback fashion.

The adder/accumulator output CS comprises bits $CS_{K-1}$ through $CS_0$. Constant multiplier 252 receives the higher order bits $CS_{K-1}$ through $CS_4$ in order to accomplish an implicit division by sixteen, the size of the sample subset, and thus, the total number of cell failure times. Thus, the embodiment of the parameter calculation unit 120 shown in FIG. 4 effortlessly accomplishes the calculation of an average cell failure time. The sample size of sixteen is chosen merely for illustration. The sample size may be chosen to be equal to any power of two. Additionally, the sample size may be chosen to be an integer other than a power of two at the expense of including a division unit in parameter calculation unit 120 to calculate the average cell failure time.

After the last cell failure time signal CFT has been incorporated into the cumulative sum, BIST unit 110 asserts a multiplier enable signal via control bus CNTL. The multiplier enable signal enables constant multiplier 252 to multiply the high order bits $CS_{K-1}$ through $CS_4$ of the adder/accumulator output CS by a predetermined constant value. As described above, this amounts to multiplying the average cell failure time by the constant value. The constant used in the constant multiplier 252 is empirically determined by characterizing the ratio of cell refresh time to cell failure time for a large number of cells of the given technology under various conditions. The output of constant multiplier 252 is supplied to BIST unit 1 10 as the refresh pause time for a data retention test of dynamic memory array 101.

Figure 4B:
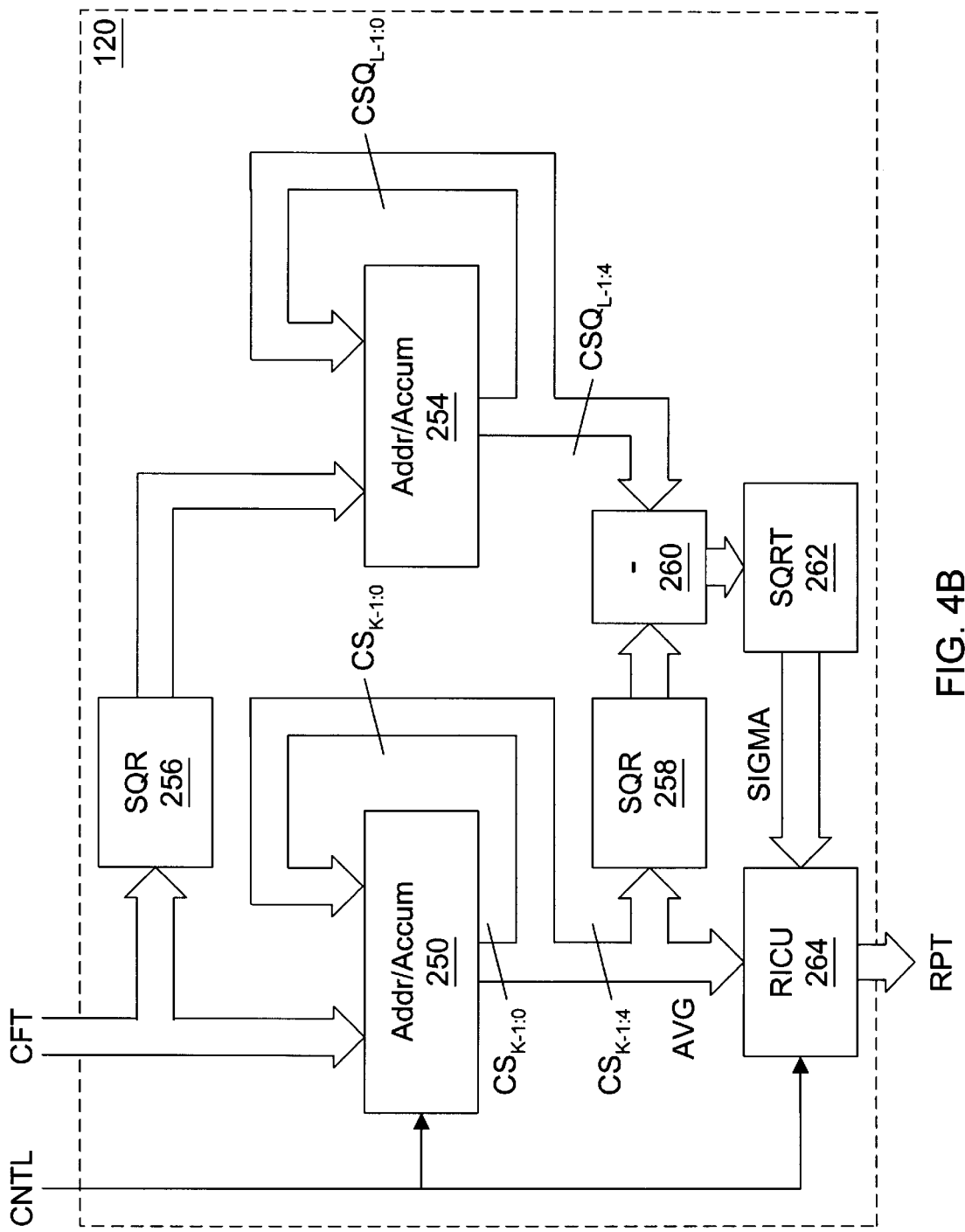
FIG. 4B depicts a second embodiment of a parameter calculation unit within a memory storage device.

Referring now to FIG. 4B, a second embodiment of parameter calculation unit 120 is shown. As shown parameter calculation unit 120 includes adder/accumulators 250 and 254, squaring units 256 and 258, subtraction unit 260, square-root evaluation unit 262, and refresh interval calculation unit 264. Adder/accumulator 250 maintains a cumulative sum of the cell failure times provided by BIST unit 110. Adder/accumulator 254 maintains a cumulative sum of the squares of the cells failure times. The output CS of adder/accumulator 250 represents the instantaneous value of the cumulative sum of failure times. The output CSQ of the adder/accumulator 254 represents the instantaneous value of the cumulative sum of squares of failure times. Adder/accumulators 250 and 254 are configured to incorporate another term into their respective cumulative sums in response to an accumulate signal asserted by BIST unit 110 through control bus CNTL.

As discussed above, an average cell failure time is forwarded to squaring unit 258 and refresh interval calculation unit 264 by passing only the high order bits $CS_{K-1}$ through $CS_4$ of output CS to squaring unit 258 and refresh interval calculation unit 264. In addition, the same principle is employed to forward an average of the sum of squares to subtraction unit 260. Namely, assuming that the output CSQ of adder/accumulator 254 comprises bits $CSQ_{L-1}$ through $CSQ_0$, by forwarding only bits $CSQ_{L-1}$ through $CSQ_4$ to subtraction unit 260, the cumulative sum of squares is implicitly divided by sixteen, the size of the sample subset. Subtraction unit is configured to subtract the output of squaring unit 258 from the average sum of squares given by bits $CSQ_{L-1}$ through $CSQ_4$. The output of subtraction unit 260 is supplied to a square-root evaluation device 262. Square-root evaluation device 262 determines the square-root of the output of subtraction unit 260. In one embodiment, square-root evaluation unit 262 is implemented by specialized logic which calculates a square root. In a second embodiment, square-root evaluation unit 262 is implemented by a lookup table. The output of the square root evaluation unit 262 represents the standard deviation of the cell failure times.

Refresh interval calculation unit 264 uses the average cell failure time and the standard deviation of cell failure time to compute a refresh pause time. In response to an enable signal asserted by BIST unit 110 through control bus CNTL, refresh interval calculation unit 264 computes and provides the refresh pause time to BIST unit 110. In one embodiment of refresh interval calculation unit 264, the refresh pause time is computed by evaluating the expression AVG−k*SIGMA, where AVG is the average cell failure time, SIGMA is the standard deviation of cell failure time, and k is an empirically determined constant.

Figure 5:
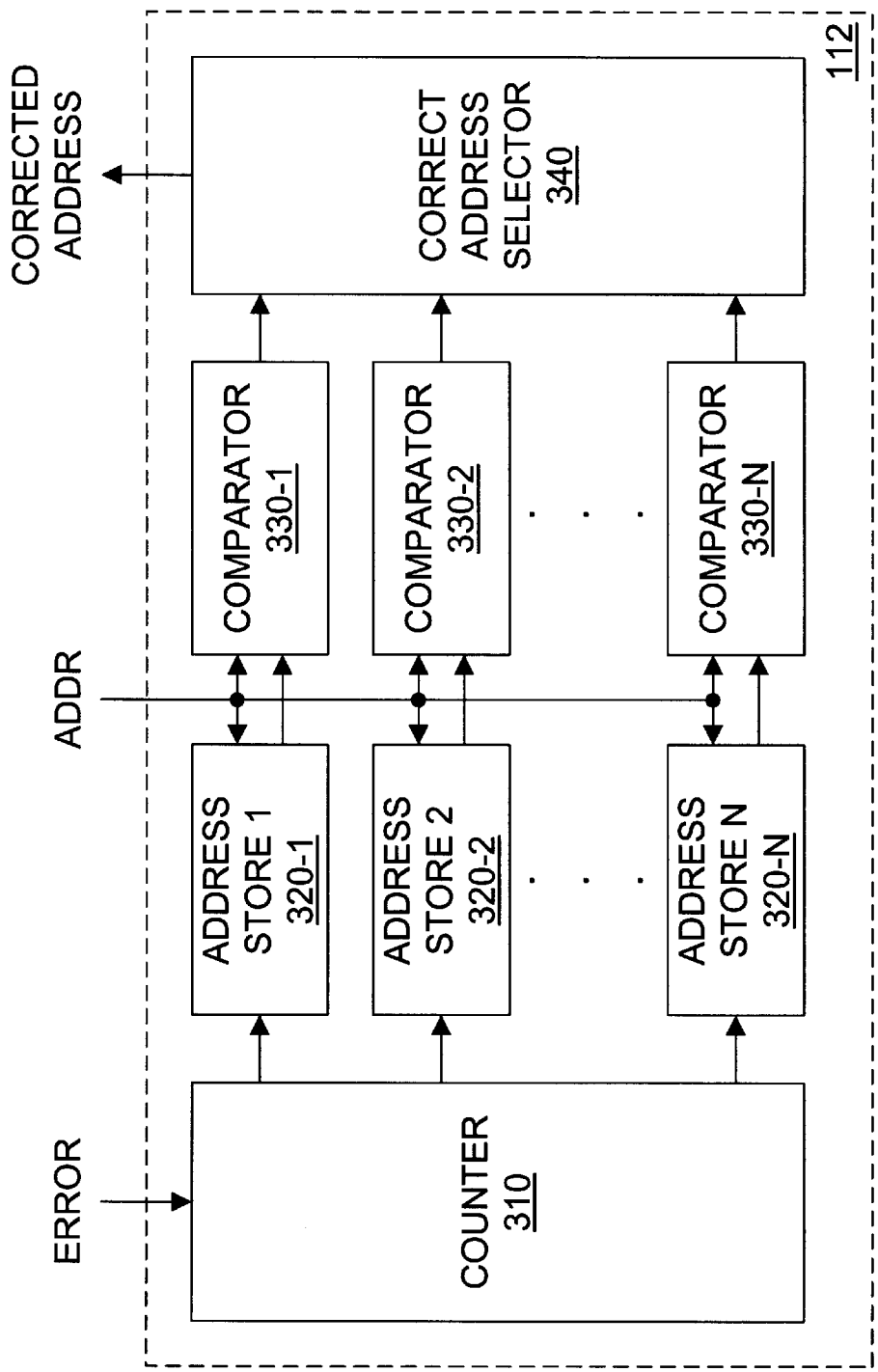
FIG. 5 depicts a block diagram of one embodiment of built-in self repair circuitry within a memory storage device.

It is noted that there exist a variety of architectures and methods for performing BISR. For example, referring to FIG. 5, a block diagram of one possible embodiment of BISR module 112 is shown. As illustrated, BISR module 112 comprises a counter 310, a plurality of address store units 320-1 through 320-N, a group of comparators 330-1 though 330-N, and an address selector 340. When an error is detected by the BIST unit 110, counter 310 sends a latch signal to one of the address stores 320, then increments. The address stores 320 are coupled to receive the uncorrected address signal at the input of multiplexer 108, and to store the uncorrected address when a corresponding latch signal is asserted. In this manner, a plurality of faulty addresses can be stored by BISR module 112. After one or more addresses have been stored, subsequent uncorrected addresses are compared by the comparators 330 to the stored addresses. A match to one of the stored addresses causes the corresponding comparator to trigger the address selector 340 to drive a corrected address to multiplexer 108 along with a control signal which causes multiplexer 108 to replace the uncorrected address with the corrected address. In this way, accesses to faulty memory locations are shunted to redundant memory locations. If more than N faulty locations are detected, counter 310 saturates, and a fatal error is indicated. A fatal error signal informs the user that the chip is not repairable and should be replaced.

In another implementation, the addresses stored and corrected by the BISR module 112 are column and/or row addresses, and separate counter, store, comparator, and selector elements are used for the column and row portions of the addresses. This allows faulty memory location replacement to occur on a column and/or row basis.

After BIST has completed, memory storage device 100 will commence normal operation. Requests to dynamic memory array 101 will be made on external address, read/write, and data signals, instead of the corresponding BIST-generated signals. In this case, the external address signal will be selected by address multiplexer 104 and conveyed upon the uncorrected address line to the BISR module 112 and correction multiplexer 108. If a match is found by the comparators 320 in BISR module 112, the address selector 340 in BISR module 112 will drive a corrected address and a multiplexer control signal to correction multiplexer 108. If a match is not found by the comparators 320, the uncorrected address is allowed to propagate through the correction multiplexer 108.

Figure 6:
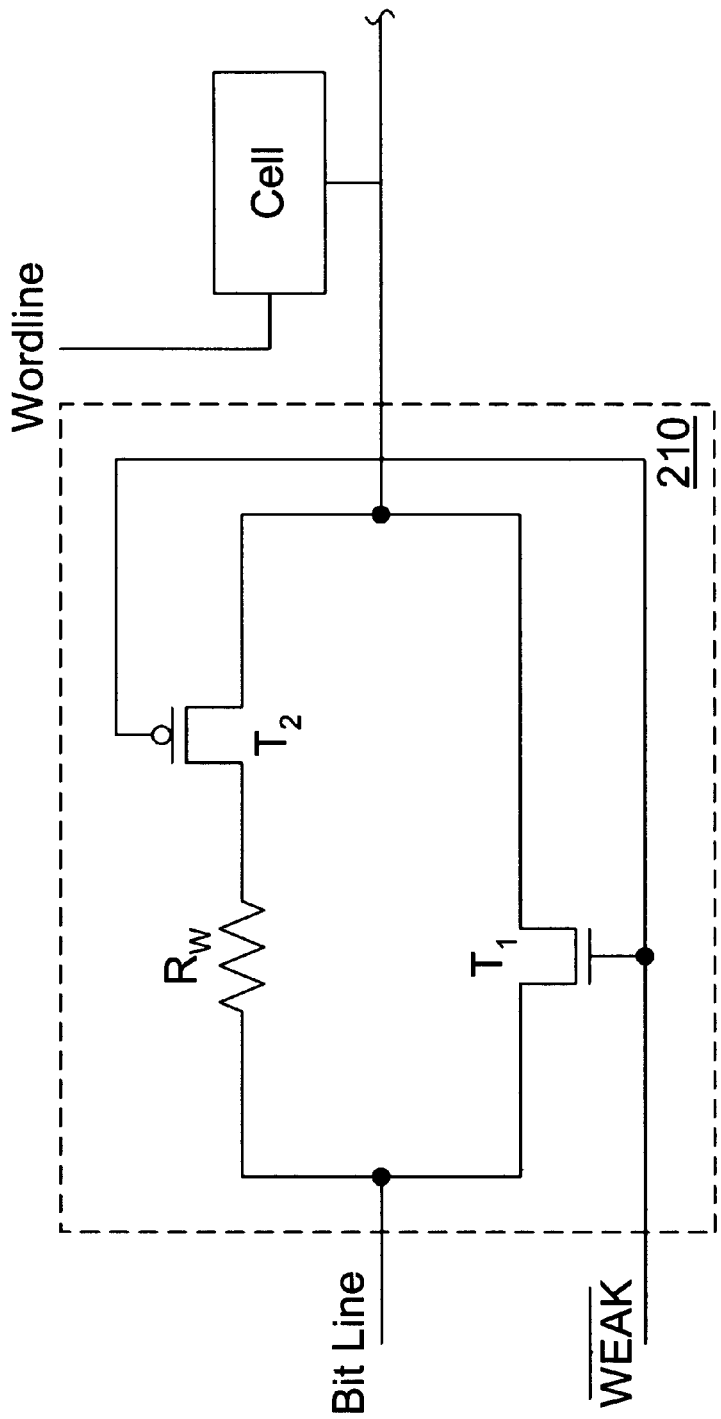
FIG. 6 depicts an embodiment of a weak write circuit within a memory array.

Referring now to FIG. 6, one embodiment of weak write circuit 210 is shown. Weak write circuit 210 is coupled to a data bit line, a weak enable line $\overline{WEAK}$, and a column line. The data bit line is coupled to one of the data lines $D_0$–$D_{M-1}$ through data write/sense amplifier 204. The column line is coupled to a column of cells in dynamic memory array 101, although for convenience only one cell of the column is illustrated in FIG. 6. Each cell of the column has a wordline which enable a read or write access to the cell, The weak write circuit 210 includes gating devices $T_1$ and $T_2$, and a resistive device $R_w$. Gating device $T_1$ is coupled to the data bit line and the column line. Resistive device $R_w$ is coupled to the data bit line and to gating device $T_2$. Gating device $T_2$ is further coupled to the column line. The weak enable line $\overline{WEAK}$ is coupled to control inputs of gating devices $T_1$ and $T_2$.

The control inputs of gating devices $T_1$ and $T_2$ are configured to selective coupling in a complementary fashion. In particular, when the weak enable line $\overline{WEAK}$ attains a first logical value, gating device $T_1$ couples the data bit line to the column line while gating device $T_2$ decouples resistive device $R_w$ from the column line. In addition, when the weak enable line $\overline{WEAK}$ attains a second logical value, complementary to the first logical value, gating device $T_1$ decouples the data bit line from the column line while gating device $T_2$ couples resistive device $R_w$ to the column line.

During normal operation, the weak enable line $\overline{WEAK}$ is held at the first logical value. Thus, normal read and write accesses occur though the direct, i.e. low impedance, path provided by gating device $T_1$. During a weak write operation, the weak enable line $\overline{WEAK}$ is held at the second logical value. Thus, the weak write operation occurs through the resistively loaded path including resistive device $R_w$ and gating device $T_2$. In this fashion, less charge is deposited the addressed cell. Therefore, the failure time for the cell will be decreased, i.e. less time is required for the deposited charge to diminish to the threshold value which defines the crossover between logical levels. Furthermore, by performing weak writes during the iterative search for the cell failure time, the total time required to determine the failure time may advantageously be decreased. Also, the time required to perform the data retention test on the whole dynamic memory array 101 may advantageously be decreased by performing weak writes instead of normal writes.

It has been noted above that the failure time and refresh interval of a DRAM cell decrease significantly with increasing temperature. In one embodiment of weak write circuit 210, resistive device $R_w$ is a polysilicon resistor. Since a polysilicon resistor exhibits a lower resistance at higher temperatures, more charge is deposited into a dynamic memory cell during a weak write than at lower temperatures. This effect compensates the tendency for leakage mechanisms to accelerate at higher temperatures, and thereby regulates the cell failure time measured by BIST unit 110. Since the value of the cell failure time varies over smaller range when the polysilicon resistor is employed, the word size for the cell failure time may be efficiently allocated.

In one embodiment of weak write circuit 210, gating device $T_1$ is an n-channel transistor, and the control input of gating device $T_1$ is the gate of the n-channel transistor. Similarly, gating device $T_2$ is a p-channel transistor, and the control input of gating device $T_2$ is the gate of the p-channel transistor.

Figure 7:
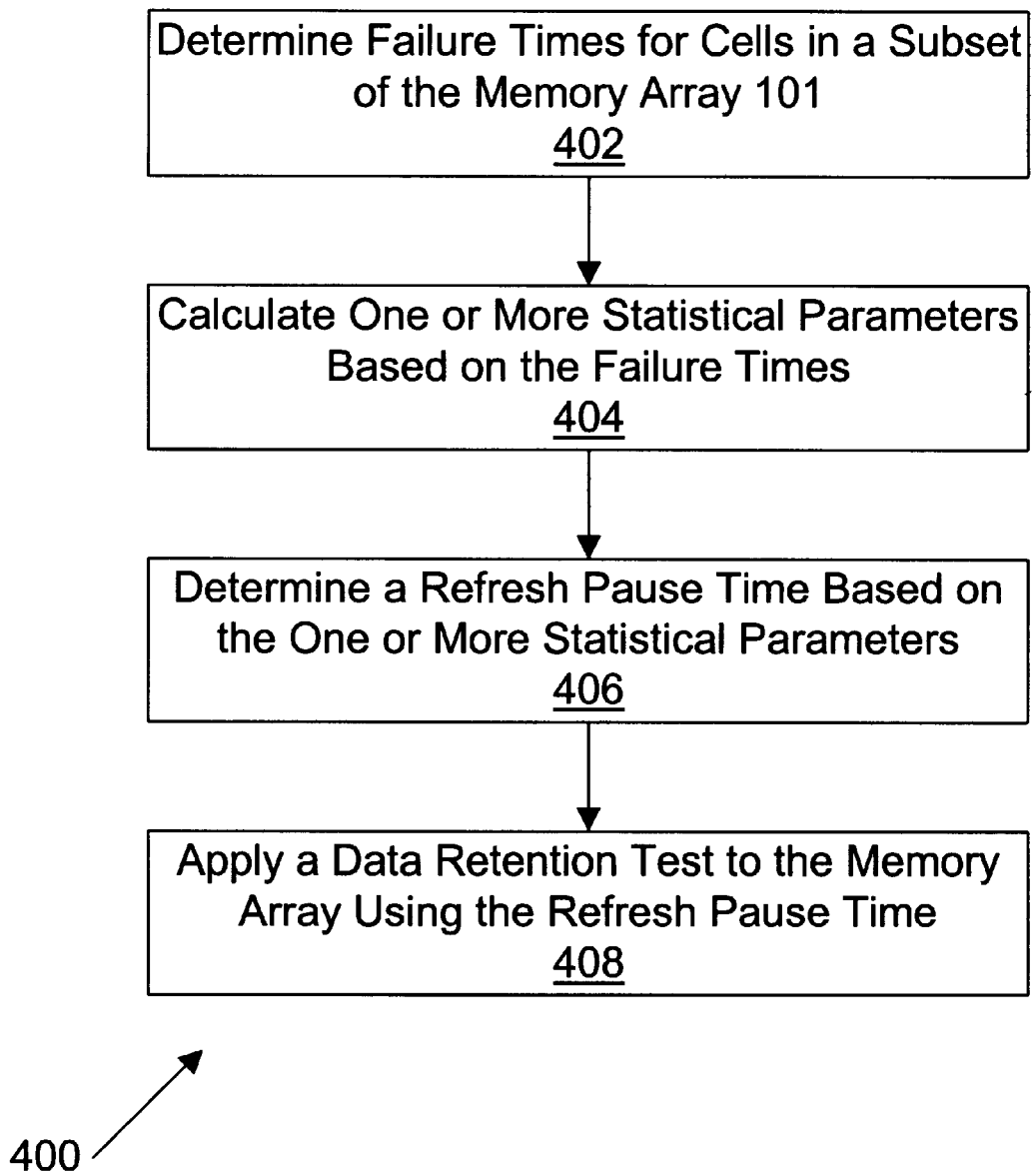
FIG. 7 depicts a flowchart of one embodiment of a method for testing a memory storage device.

Referring now to FIG. 7, a flowchart of a test method 400 for memory storage device 100 is shown. As an initial step 402, the test method 400 involves determining failure times for cells in a subset of the dynamic memory array 101. In step 404, the test method 400 prescribes calculating one or more statistical parameters based on the failure times from the subset. In one embodiment, the one or more statistical parameters includes an average cell failure time. In a second embodiment, the one or more statistical parameters includes an average cell failure time and a standard deviation of cell failure time. It is noted that step 402 and 404 are preferably performed in parallel. In other words, the one or more statistical parameters are developed as the failure times are successively produced.

In step 406, the test method 400 dictates determining a refresh pause time based on the one or more statistical parameters. In one embodiment, the refresh pause time is determined by multiplying an average cell failure time by a scaling factor. The scaling factor is determined from empirically characterizing the ratio of refresh pause time to failure time for a large number of cells of the given technology at various temperatures. In a second embodiment, the refresh pause time is determined by evaluating the expression AVG−k*SIGMA, where AVG is an average cell failure time, SIGMA is a standard deviation of the cell failure time, and k is an empirically determined constant. It is noted that other embodiments are easily envisioned which calculate a refresh pause time from an average and standard deviation of cell failure time using formulas other than the linear expression given above. In step 408, the test method 400 further involves applying a data retention test to the dynamic memory array 101 using the refresh pause time. The data retention test is used to identify the addresses of faulty cells within the dynamic memory array 101.

In one embodiment of test method 400, steps 402 through 408 are performed when power is applied to dynamic memory device 400. In a second embodiment of test method 400, steps 402 through 408 are performed in response to dynamic memory array 101 attaining a predetermined operational temperature. In this second embodiment, heating elements and temperature sensors may be included to accelerate the attainment of operational temperature. In a third embodiment of the test method 400, steps 402 through 408 are performed in response to a command asserted by an operating system routine executing on a central processing unit coupled to the dynamic memory device 400. In a fourth embodiment of test method 400, steps 402 through 408 may be performed in response to a user input. In a fifth embodiment, test method 400 further includes the step of mapping addresses of faulty cells identified by the data retention test to the addresses of redundant memory cells comprised within the memory device 100 (and especially within dynamic memory array 101).

Figure 8:
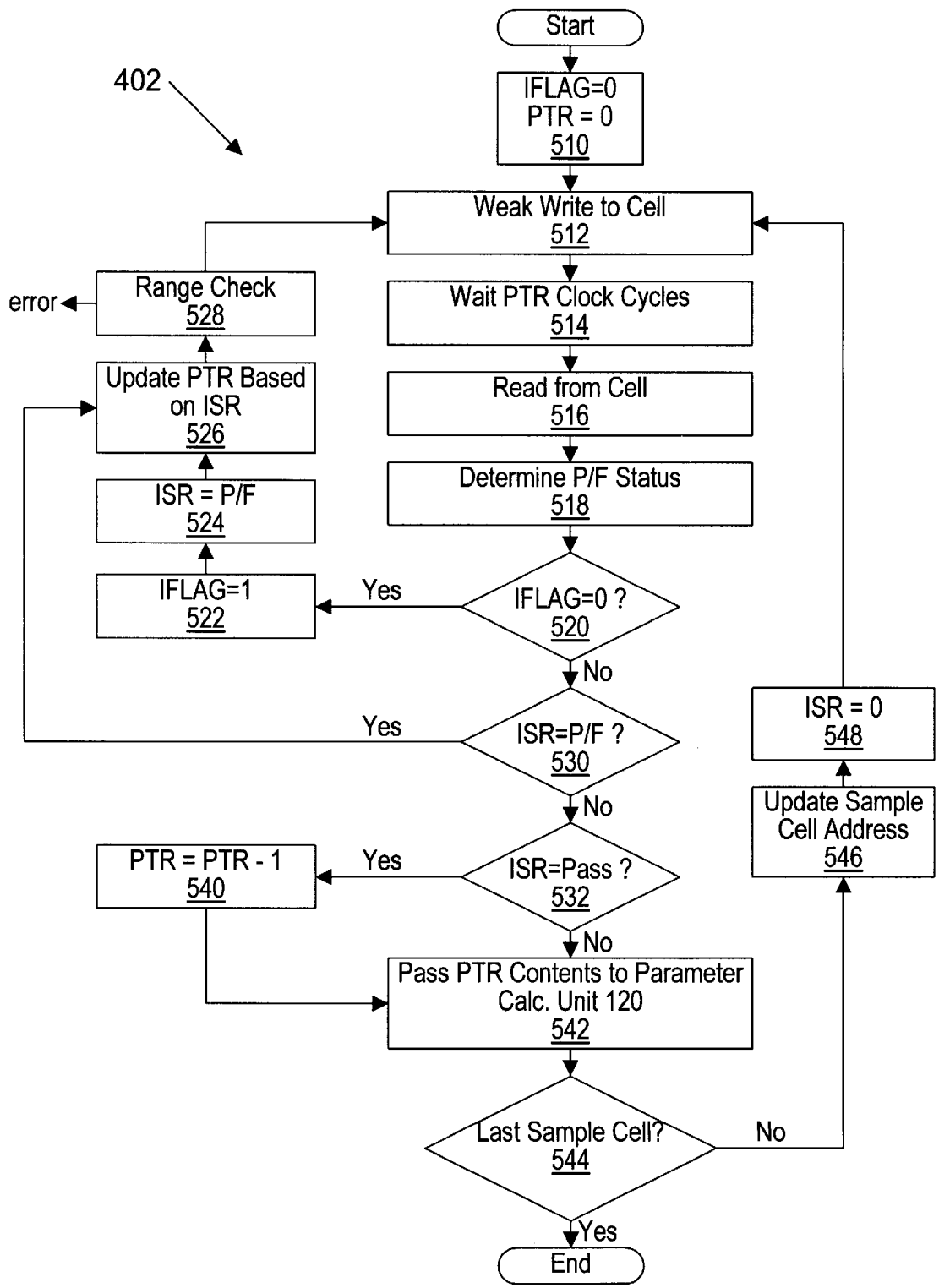
FIG. 8 depicts a flowchart for one embodiment of a method for determining failure times for cells within a memory array.

Referring now to FIG. 8, one embodiment of step 402, i.e. the determination of failure times for cells in a subset of the dynamic memory array 101, is shown. In step 510, state machine controller 212 initializes pause time register PTR to zero, and sets iteration flag IFLAG to zero. In step 512, state machine controller 212 directs a weak write of a logical 1 value to a first addressed cell of the dynamic memory array 101. Data generator 230 provides the logical 1 as the data in signal to dynamic memory array 101 in response to control signals from state machine controller 212. Herein, a logical 1 value is defined as that logical value which is associated with the deposition of charge in a cell during a write operation. In step 514, state machine controller 212 pauses for a time interval given by the pause time register PTR. After the pause interval, in step 518, state machine controller 212 directs a normal read operation on the same cell that was written in step 512. The logical value returned from the addressed cell is provided as the data out signal from the dynamic memory array 101.

In step 518, comparator 240 compares the logical 1 value to the returned logical value to determine whether or not the addressed cell has retained the logical 1 value. The output of comparator 240 is stored in pass/fail register P/F. Pass/fail register P/F takes the value Pass if the logical 1 value and the returned logical value agree, and takes the value Fail otherwise. In step 520, state machine controller 212 tests the value of iteration flag IFLAG. If IFLAG takes the value zero, indicating a first iteration of the search procedure, step 522 is performed. In step 522, state machine controller sets the iteration flag to 1. In step 524, the initial state register ISR is assigned the value of pass/fail register P/F. Thus, the initial state register ISR reflects the result of the first data retention test on the addressed cell.

In step 526, state machine controller 212 updates the pause time register PTR based on the value of the initial state register ISR. In particular, the pause time register is incremented if the initial state register ISR takes the value Pass, and decremented if the initial state register ISR takes the value Fail. In step 528, state machine controller 212 performs a range check on the value of the pause time register PTR. In particular, state machine controller 212 determines if the value of the pause time register PTR obeys the inequality $0 \leq PTR \leq T_{max}$, where $T_{max}$ is the maximum pause time. If the value of the pause time register PTR is less than zero, the iteration loop exits with an error and another cell is selected with the PTR register reset to zero. This may occur if the cell under examination is functionally bad. Similarly, if the value of the pause time register PTR is greater than $T_{max}$, indicating a cell stuck at the logical 1 value, an error would be generated. If the range check is successful, processing resumes with step 512, whereupon a data retention test is performed with the updated pause time and a new pass/fail status is determined.

If in step 520, the iteration flag I FLAG is not equal to zero, step 530 is performed. In step 530, state machine controller 212 compares the value of the initial state register ISR and the current pass/fail status as reflected by the contents of the pass/fail register P/F, If the value of the initial state register ISR and the current P/F register value agree, step 526 is performed. If the value of the initial state register ISR and the current P/F register value disagree, the transition from data retention to non-retention has been detected, and step 532 is performed to determine whether a decrement adjustment is necessary before declaring the cell failure time. In the embodiment of step 402 shown in FIG. 8, the cell failure time is defined as the maximum pause time interval corresponding to data retention. Thus, when the cell transitions from data retention to non-retention, the value of the pause time register PTR will be one larger than the cell failure time and requires a decrement adjustment.

In step 532, state machine controller 212 determines if the initial state register ISR takes the value Pass. If so, the pause time register PTR is decremented as shown in step 540. After step 540, or after a negative determination in step 532, step 542 is performed. In step 542, state machine controller passes the value of the pause time register, which now reflects the cell failure time, to the parameter calculation unit 120.

In step 544, state machine controller 212 determines if the current completed cell is the last cell of the sample subset. If there are remaining cells in the subset, state machine controller 212 directs address generator 220 to address the next cell of the sample subset and reinitializes the ISR register to zero as shown in steps 546 and 548. If there are no remaining cell in the subset, step 402 is ended.

It is noted that pause time register PTR is not cleared after the determination of a cell failure time. Since the cell failure time for the next cell of the sample subset is likely to be close to the current cell failure time, the number of iterations required to identify the next cell failure time may be advantageously minimized by retaining the pause time register value from one cell failure time determination to the next.

Numerous variations and modifications will become apparent to those skilled in the art once the above disclosure is fully appreciated. It is intended that the following claims be interpreted to embrace all such variations and modifications.

What is claimed is:

1. A method for on-chip testing of a memory device that contains a memory array, the method comprising:

determining failure times for cells in a first subset of the memory array;

calculating one or more statistical parameters based on said failure times;

determining a first refresh pause time based on said one or more statistical parameters; and applying a data retention test to the memory array using the first refresh pause time, wherein said data retention test identifies an address of a faulty cell within the memory array.

2. The method of claim 1, wherein said determining failure times for cells in a first subset of the memory array comprises determining a first failure time for a first cell in the subset, wherein said determining a first failure time for a first cell in the subset comprises:

writing said first cell with a first logical value;

pausing for a first time interval;

reading said first cell to obtain a first returned value; and examining said first returned value to determine whether said first cell has retained said first logical value;

repeatedly performing said writing, pausing, reading, and examining of said first cell with changing values of said first time interval;

detecting a first value of said first time interval which indicates a transition between retention and non-retention of said first logical value in said first cell; and assigning said first value to be the first failure time for said first cell.

3. The method of claim 2, wherein said determining failure times for cells in a subset of the memory array further comprises determining a second failure time for a second cell in the subset prior to said determining said first failure time for the first cell in the subset, wherein said determining said first failure time for the first cell further comprises initializing the first time interval to the second failure time prior to a first iteration of said repeatedly performing said writing, pausing, reading, and examining of said first cell.

4. The method of claim 2, wherein said repeatedly performing said writing, pausing, reading, and examining includes:

increasing said first time interval if said examining determines that said first returned value is equal to said first logical value; and decreasing said first time interval if said examining determines that said first returned value is not equal to said first logical value.

5. The method of claim 1, wherein said calculating one or more statistical parameters based on said failure times includes calculating an average failure time for said cells in said first subset of the memory array.

6. The method of claim 5, wherein said determining a first refresh pause time comprises multiplying said average failure time by a scaling constant.

7. The method of claim 5, wherein said calculating one or more statistical parameters based one said failure times further includes calculating a standard deviation for the failure times.

8. The method of claim 7, wherein said determining a first refresh pause time comprises evaluating the expression AVG−k*STDEV, where k is a positive constant, AVG is the average failure time, and STDEV is the standard deviation of the failure times.

9. The method of claim 1, wherein said determining failure times for cells in said first subset, said calculating one or more statistical parameters, said determining a first refresh pause time, and said applying a data retention test to the memory array are performed in response to power being applied to the memory device.

10. The method of claim 1 further comprising waiting until said memory array attains a predetermined operational temperature, wherein said waiting is performed prior to said determining failure times for cells in said first subset of the memory array.

11. The method of claim 1, wherein said determining failure times for cells in said first subset, said calculating one or more statistical parameters, said determining a first refresh pause time, and said applying a data retention test to the memory array are performed in response to a command asserted by an operating system routine executing on a central processing unit coupled to the memory device.

12. The method of claim 1 further comprising mapping the address of the faulty cell to the address of a redundant memory cell comprised within said memory device.

13. A system for detecting data retention faults, wherein the system comprises:

a memory array including a plurality of memory cells;

a testing unit coupled to the memory array, and configured to determine the failure times for a first subset of said plurality of memory cells; and a parameter calculation unit coupled to receive said failure times, and configured to determine a first refresh pause time based on said failure times;

wherein said testing unit is further coupled to receive the first refresh pause time, and further configured to detect faulty cells among said plurality of memory cells by performing a data retention test using said refresh pause time.

14. The system of claim 13, wherein the parameter calculation unit includes a first adder/accumulator to maintain a first cumulative sum of said failure time, wherein said parameter calculation unit is configured to determine an average failure time from said first cumulative sum.

15. The system of claim 14, wherein the parameter calculation unit is configured to determine said first refresh pause time by multiplying said average failure time by a predetermined constant value.

16. The system of claim 14, wherein the parameter calculation unit further includes a second adder-accumulator to maintain a second cumulative sum of squares of said failure times, wherein said parameter calculation unit is configured to determine a standard deviation of failure time from said first cumulative sum and said second cumulative sum.

17. The system of claim 16, wherein the parameter calculation unit is configured to determine said first refresh pause time by evaluating the expression AVG−k*SIGMA, wherein AVG is the average failure time, and SIGMA is the standard deviation of said failure times, and k is a constant.

18. The system of claim 13 further comprising:

a plurality of redundant memory cells included within said memory array;

a repair module coupled to receive a first address of a first faulty cell from said testing unit, and configured to store the first address of the first faulty cell and to associate said first address with a second address of one of said plurality of redundant memory cells;

wherein said repair module is configured to intercept accesses to said first faulty cell and to reroute said accesses to said one of said plurality of redundant memory cells.

19. The system of claim 13, wherein said testing unit is configured to write a first logical value to a first cell, to pause for a first time interval, to read said first cell to obtain a first returned value, wherein said testing unit includes a first comparator for comparing said first returned value with said first logical value, wherein an output of said first comparator indicates whether said first cell has retained said first logical value.

20. The system of claim 19, wherein said testing unit is configured to repeat said writing, pausing, and reading of said first cell using changing values of said first time interval, wherein said testing unit is further configured to detect a first value of said first time interval which indicates a transition between retention and non-retention of said first logical value, and wherein said testing unit is configured to provide said first value to said parameter calculation unit as a first failure time for said first cell.

21. The system of claim 20, wherein said testing unit includes a first register for determining the length of said first time interval.

22. The system of claim 21, wherein said testing unit is configured to increment said first register when the output of said first comparator indicates that said first returned value is equal to said first logical value, and to decrement said first register when the output of said first comparator indicates that said first returned value is not equal to said first logical value.

23. The system of claim 20, wherein said testing unit includes a second register for storing the output of said first comparator from a first iteration of said repeated writing, pausing, and reading.

24. The system of claim 23, wherein said testing unit is configured to compare the output of said first comparator with the value of said second register after each iteration of said repeated writing, pausing, and reading, wherein a disagreement between said output of said first comparator and the value of said second register indicates said transition between retention and non-retention of said first logical value.

25. The system of claim 13, wherein said memory array includes a first weak write circuit coupled to said testing unit through a data line, wherein said first weak write circuit is configured to selectively couple said data line to one or more of said plurality of memory cells through either a direct path or a resistively loaded path in response to a weak enable input provided by said testing unit;

wherein said testing unit is operable to control said weak enable input to select the resistively loaded path for write accesses during a first phase wherein said testing unit determines said failure times for said first subset of cells, and during a second phase wherein said testing unit detects faulty cells among said plurality of memory cells; and wherein said testing unit is operable to control said weak enable input to select the direct path when said testing unit performs read accesses to said memory array.

26. A memory device comprising:

a plurality of memory cells;

a data line;

a first weak write circuit coupled to said data line and one or more cells of said plurality of memory cells, wherein said first weak write circuit includes:

a first gating device coupled to said data line and said one or more cells;

a resistive device coupled to said data line;

a second gating device coupled to said resistive device and said one or more cells; and a weak enable line coupled to a first control input of said first gating device and to a second control input of said second gating device;

wherein said first gating device is configured to couple said data line to said one or more cells when a first logical value is asserted on said weak enable line;

wherein said second gating device is configured to decouple said resistive device from said one or more cells when said first logical value is asserted on said weak enable line;

wherein said first gating device is configured to decouple said data line from said one or more cells when a second logical value is asserted on said weak enable line; and wherein said second gating device is configured to couple said resistive device to said one or more cells when said second logical value is asserted on said weak enable line;

wherein said second logical value is the complement of said first logical value.

27. The system of claim 26, wherein said resistive device is a polysilicon resistor.

28. The system of claim 26, wherein said first gating device is an n-channel transistor, and wherein said first control input is the gate of said n-channel transistor.

29. The system of claim 26, wherein said second gating device is a p-channel transistor, and wherein said second control input is the gate of said p-channel transistor.

* * * * *